United States Patent [19]

McClure

[11] Patent Number: 5,513,143
[45] Date of Patent: Apr. 30, 1996

[54] DATA CACHE MEMORY INTERNAL CIRCUITRY FOR REDUCING WAIT STATES

[75] Inventor: David C. McClure, Carrollton, Tex.

[73] Assignee: SGS-Thomson Microelectronics, Inc., Carrollton, Tex.

[21] Appl. No.: 923,856

[22] Filed: Jul. 31, 1992

[51] Int. Cl.⁶ .................................................. G11C 7/00
[52] U.S. Cl. .............. 365/195; 365/189.05; 365/189.08; 395/445; 364/243.41
[58] Field of Search ........................ 365/189.05, 189.08, 365/189.07, 49, 190, 195, 189.01; 395/425; 364/243.41

[56] References Cited

U.S. PATENT DOCUMENTS

| | | | |
|---|---|---|---|
| 4,882,709 | 11/1989 | Wyland | 365/189.02 |
| 4,998,221 | 3/1991 | Correale, Jr. | 365/189.07 |
| 5,043,943 | 8/1991 | Crisp et al. | 365/189.01 |
| 5,111,386 | 5/1992 | Fujishima et al. | 395/425 |
| 5,179,679 | 1/1993 | Shoemaker | 395/425 |
| 5,321,651 | 6/1994 | Monk | 365/189.01 |

*Primary Examiner*—David C. Nelms
*Assistant Examiner*—Andrew Q. Tran
*Attorney, Agent, or Firm*—Renee M. Larson; Lisa K. Jorgenson; Richard K. Robinson

[57] ABSTRACT

The mechanism for performing writes to the data cache memory in a cache subsystem is modified to reduce the occurrence of microprocessor wait states. Concurrently, with operation of the tag RAM, the write signal from the microprocessor propagates through the data cache up to a point in the internal circuitry of the data cache which is as close as reasonably possible to the memory cell being written. At this point in the circuitry, the write signal is gated by the Match signal from the tag RAM. Address decoding is completed prior to receiving the Match signal, such that when the tag RAM generates a "hit" Match output signal, the write signal is allowed to finish propagating through data cache internal circuitry without additional address set-up time. This allows the memory cell to be written to quickly and reduces the probability of microprocessor wait states. In a preferred embodiment of the present invention, the write signal propagates to a logic function, such as a logic gate, where it is gated by the Match signal from the tag RAM and data. When the tag RAM generates a "hit" Match output signal, the write signal as well as the data is allowed to finish propagating to the memory cell.

14 Claims, 1 Drawing Sheet

DATA CACHE MEMORY INTERNAL CIRCUITRY FOR REDUCING WAIT STATES

BACKGROUND OF THE INVENTION

1. Field of the Invention

The present invention relates generally to integrated circuits, and more specifically to a data cache memory.

2. Description of the Prior Art

A computer system is composed of major building blocks including, but not limited to, the processor, main memory, and control logic. The processor often requires data to perform calculations, which it obtains from main memory, typically a very large Dynamic Random Access Memory (DRAM). As computer microprocessors have become faster and faster, the rate at which data must be supplied to them must increase as well. Unfortunately, the rate at which DRAMs can operate is usually much slower than the speed of the microprocessor in the same computer system. Therefore, when the microprocessor requests data from main memory it may have to wait several cycles, during which time it is idle and unproductive. These unproductive cycles are referred to as "wait states" since the microprocessor simply waits for the needed data to be provided by main memory.

Cache memories provide a valuable tool for increasing computer system performance by reducing or even eliminating microprocessor wait states. The cache memory has a very fast data cache in which a copy of a portion of main memory data is stored. This data cache is much faster than the main memory, and so it can supply data to the microprocessor very quickly, possibly before it incurs a wait state.

The typical cache subsystem is comprised of five blocks: microprocessor, main memory, tag RAM, data cache, and control logic. When the microprocessor requests information, a read signal is immediately sent to both the main memory and the tag RAM. The tag RAM holds the address locations of all data which is stored in the data cache. The tag RAM compares the requested memory address with the memory addresses of all data stored in the data cache. If the requested memory address is in the tag RAM, a "hit" condition exits, and data from that location will be gated from the data cache to the microprocessor. In a "hit" condition, the tag RAM generates a compare Match output signal. In the hit condition, the data cache gates the required data onto the data bus before the main memory can respond. In this way, microprocessor wait states are avoided. However, if the tag RAM's comparison operation indicates that the desired data is not stored inside the data cache, a "miss" condition exists, and the data must come from main memory. As a result, microprocessor wait states are incurred and overall computer performance is compromised.

The mechanism for reading data from the data cache is efficient and straightforward. During cache reads, the data cache can typically be read before the tag RAM indicates whether a hit or miss condition exists. Therefore, the data cache can be read in parallel to the tag comparison; if the tag RAM registers a "hit" condition, the data cache outputs are enabled immediately. If a "miss" condition exists, the outputs are not enabled and main memory will ultimately drive the data bus. This parallel activity saves time and can result in the data being read in a single cycle with no microprocessor wait states.

Sometimes it becomes necessary to update the information stored inside the data cache by performing a data cache write. For data cache writes, the parallel activity associated with data cache reads is not possible with most SRAMS used for data caches. In a data cache write, the write can only occur once a "hit" is registered from the tag RAM; otherwise, erroneous data might mistakenly be written in the data cache on a tag RAM "miss", and data coherency problems with the main memory could result. In other words, when the microprocessor is allowed to write to the data cache before a tag RAM "miss" condition is determined, the microprocessor will write data into a memory address location which does not correspond to a specific main memory address location. This could mean that, for a particular address location, the data stored in the data cache does not match the data stored in main memory. Because the compare operation of the tag RAM and the cache write occur serially, the write takes additional time, possibly causing microprocessor wait states.

SUMMARY OF THE INVENTION

It would be advantageous in the art if data cache writes were quicker such that fewer microprocessor wait states were incurred. This could be accomplished if data cache writes were altered to more closely resemble data cache reads which are parallel in nature. The parallelization of data cache writes would reduce the occurrence of microprocessor wait states.

According to the present invention, the mechanism for performing writes to the data cache in a cache subsystem is modified to reduce the occurrence of microprocessor wait states. Concurrently, with operation of the tag RAM, the write signal from the microprocessor propagates through the data cache up to a point in the internal circuitry of the data cache which is as close as reasonably possible to the memory cell being written. At this point in the circuitry, the write signal is gated by the Match signal from the tag RAM. If the tag RAM generates a "hit" Match output signal, the write is allowed to finish propagating through data cache internal circuitry without additional address set-up time. This allows the memory cell to be written to quickly and reduces the probability of microprocessor wait states.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
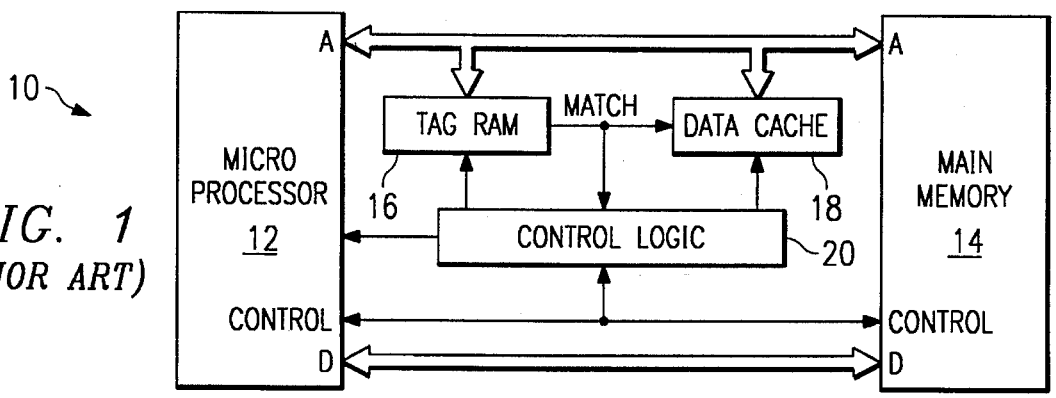
FIG. 1 is a block diagram of a cache subsystem according to the prior art.

FIG. 1 shows a block diagram of a cache subsystem according to the prior art. A typical cache subsystem 10 is comprised of five main elements: microprocessor 12, main memory 14, tag RAM 16, data cache 18, and control logic 20. The microprocessor 12 could obtain all needed data from the slow main memory 14. However, since the typical main memory is much slower than the typical microprocessor, the microprocessor 12 must incur "wait states" until the data arrives from main memory 14. During wait states, microprocessor 12 is idle. Wait states have a negative impact on the efficiency of the processor and, therefore, on computer performance.

For these reasons, cache subsystem 10 is used to provide the microprocessor with data in a more timely fashion, in the hopes of reducing or even eliminating microprocessor wait states. The cache, composed of a tag RAM 16, a data cache 18, and control logic 20, resides between the microprocessor 12 and main memory 14. Smaller and faster than main memory 14, data cache 18 stores a copy of frequently accessed main memory data. Storing data commonly accessed by the microprocessor 12, increases the likelihood that data cache 18 will have the needed data in the event of a microprocessor memory cycle.

Transparent to main memory 14, the data cache 18 supplies data to microprocessor 12 if it has the requested data. The tag RAM 16 provides the mechanism by which it is determined if the data cache 18 has the data requested by the microprocessor 12. The tag RAM 16 stores the memory addresses of all data stored in the data cache 18. Upon a microprocessor read, the tag RAM 16 compares the address of the data being sought with the addresses of data stored in the data cache 18. If a "hit" or match condition exists, the tag RAM 16 generates a logic high Match output signal which indicates that data cache 18 does have the desired data. Data from the data cache 18 is then gated onto the data bus where it is received by the microprocessor 12. If, however, the tag RAM 16 determines the desired data address does not match any addresses stored in the data cache 18, a "miss" condition exists. In response to a "miss" condition, the tag RAM 16 generates a logic low Match output signal.

Once tag RAM 16 has performed a comparison operation and determined if the data cache 18 contains the data of the memory address being requested, it generates a Match output signal. The Match output signal is an input to data cache 18 and functions as a high-speed chip select which allows or does not allow data from the data cache to be gated onto the data bus to the microprocessor. When deselecting the data cache 18, the outputs of the cache are tri-stated. During most data cache read cycles, the data cache 18 can typically begin to be read even before the tag RAM 16 has completed its comparison function. So, the data cache 18 can be read in parallel to the tag RAM comparison. If the tag RAM comparison function indicates a "hit" condition, then the data cache outputs are simply enabled. If a "miss" condition is indicated, the outputs of the data cache 18 are not enabled and main memory 14 will ultimately supply the data to the microprocessor 12. When a "miss" occurs, the unnecessary read does not cause problems because the contents of the data cache memory location are unchanged and the data is simply discarded. This parallel activity during data cache read cycles saves time and can possibly allow the data to be read by the microprocessor 12 in a single cycle, with no wait states.

The data cache write cycle for most data caches does not occur in this parallel manner. Typically, the write can only occur once a hit is registered, otherwise data stored in the data cache 18 may be mistakenly altered. If data is written before the tag RAM 16 can generate a "miss" Match output signal, data inside the data cache 18 might no longer match the data of the corresponding address location inside main memory 14. This could result in the wrong data being written to the wrong address location in the data cache 18. This discrepancy may lead to cache coherency problems and must be avoided. Thus extra microprocessor wait states may be incurred while servicing the microprocessor write cycle.

In a data cache according to the present invention, the data to be written is presented to the cache while the tag RAM 16 is performing its comparison operation. The address of the data to be written is also presented. The data values propagate only partway into the data cache 18, and are prevented from actually writing any data into the array. Once the tag RAM 16 indicates a hit, the data is actually written into the array. Therefore, it is the tag RAM Match signal which determines if the write signal will continue propagation to the targeted memory cell. When deselecting the data cache 18, the outputs of the data cache are tri-stated and writes are disabled at the I/O circuitry, perhaps just prior to the chip's bit lines. The gating of the microprocessor write signal by the tag RAM 16 Match signal occurs in the internal circuitry of data cache 18 and will be explained in depth in conjunction with FIG. 3.

Figure 2:
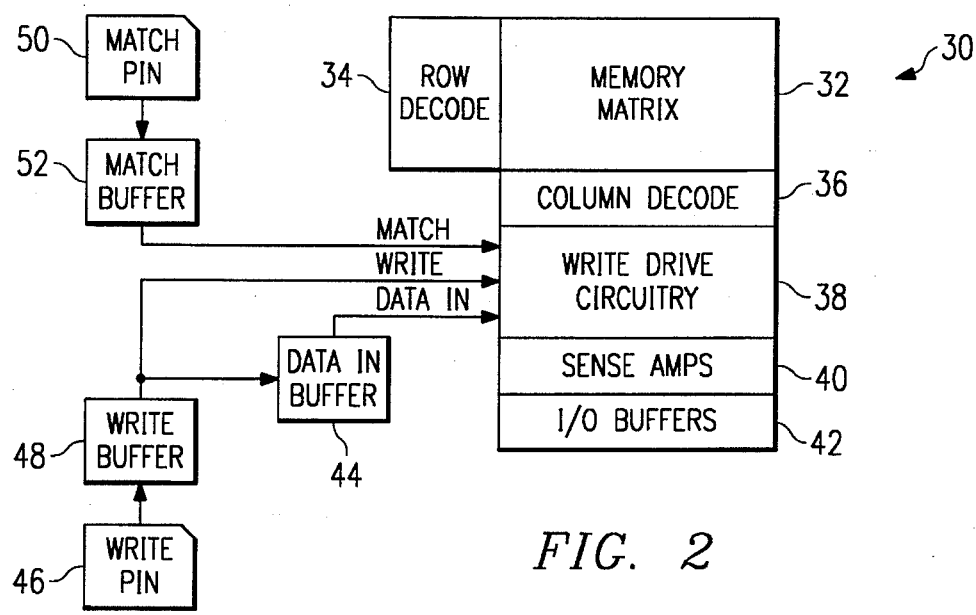
FIG. 2 is a block diagram of a data cache memory according to the present invention.

Turning now to FIG. 2, a block diagram of a data cache memory according to the present invention is shown. A data cache memory 30 is comprised of several important functional blocks. Memory matrix 32 stores data, and row decode 34 and column decode 36 provide decoding abilities for memory matrix 32. Write driver circuitry 38, sense amps 40, and I/O buffers 42 provide the data cache 30 with interface abilities with circuitry outside data cache 30. Two inputs to the data cache 30 are the Match signal which is generated by the tag RAM and the write signal from the microprocessor as shown in FIG. 1. The Match signal enters the data cache 30 via Match pin 50 wherein it promptly enters Match buffer 52 before becoming an input to write driver circuitry 38. Similarly, the write signal from the microprocessor enters data cache 30 via Write pin 46 after which it is then presented as an input to write buffer 48. After write buffer 48, the write signal is an input to write driver circuitry 38; additionally, the output of write buffer 48 is an input to data in buffer 44 which generates data in signals 45. FIG. 2 is a logical representation, not a physical representation of the major components of data cache 30. Buffers 44, 48 and 52 are buffers of the type known in the art.

Figure 3:
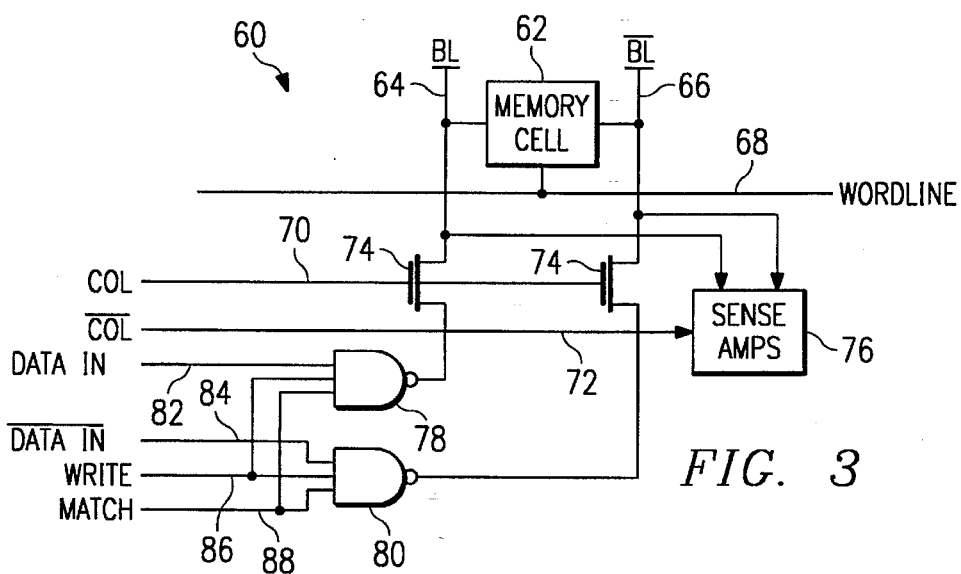
FIG. 3 is a schematic of a data cache memory according to the present invention.

FIG. 3 is a schematic of a data cache memory according to the present invention and illustrates additional details of the circuitry shown in FIG. 2. Data cache 60 in FIG. 3 shows a memory cell 62 from the memory matrix shown in FIG. 2. Connected to memory cell 62 is bit line BL 64 and bit line $\overline{BL}$ 66, which is the inverse of BL 64. Also connected to memory cell 62, at right angles to BL 64 and $\overline{BL}$ 66, is wordline 68. Signal lines COL 70 and $\overline{COL}$ 72 perform column decode functions for memory cell 62. COL 70 is connected to n-channel pass gates 74, whereas $\overline{COL}$ 72 is an input to sense amp block 76. Prior to the column decode logic, BL 64 and BL 66 are directed as inputs to sense amp logic 76. Logic gates 78 and 80, in this case NAND gates, determine during a microprocessor write cycle whether write memory cell 62 will be written to. Logic gate 78 has as inputs Data In 82, Write signal 86, and Match signal 88. Similarly, logic gate 80 has as inputs $\overline{\text{Data In}}$ 84, Write signal 86, and Match signal 88.

Memory cell 62 may be written to if certain conditions are met: Data In 82 or $\overline{\text{Data In}}$ 84 are logic highs, Write signal 86 is a logic high, and Match signal 88 is a logic high. Also, Wordline 68 and COL 70 must be at a logic high before the memory cell write may take place. The write operation is accomplished by pulling BL 64 or $\overline{BL}$ 66 to a logic low. When BL 64 is pulled to a logic low, a "0" or logic low is written to memory cell 62, and when $\overline{BL}$ 66 is pulled to a logic low, a "1" or logic high is written to memory cell 62.

As described above, it is logic gates 78 and 80 which gate the writing of memory cell 62. So, upon a write cycle from the microprocessor, Write signal 86 is allowed to propagate up to logic gates 78 and 80, a point very close to memory cell 62. The only circuitry between logic gates 78 and 80 and memory cell 62 is the column decode logic which is represented by COL 70, $\overline{\text{COL}}$ 72, and n-channel pass gates 74. When a logic high Match signal 88 is received, the write signal 86 is allowed to finish propagating to the memory cell.

Logic gates 78 and 80 provide the mechanism for performing data cache writes which are more parallel in nature than the serial operation of the prior art described in FIG. 1. Upon a write cycle from the microprocessor, Write signal 86 propagates through the internal circuitry of the data cache at the same time the tag RAM is generating Match signal 88. Additionally, Data In signals are also allowed to propagate through the internal circuitry of the data cache up to the same point as Write signal 86. When Write signal 86 is initially received by the data cache 60, it is allowed to propagate up to a point in the internal circuitry as close as is possible to the targeted memory cell without actually affecting the memory cell; in this case, Write signal 86 propagates up to logic gates 78 and 80 just prior to bit lines BL 64 and $\overline{\text{BL}}$ 66. Write signal 86 will remain at this point in the circuitry until it is determined from the tag RAM if the data cache does indeed contain the desired data.

The address is decoded while the tag RAM is determining whether a match condition exists. The addressed word line is driven high, accessing the appropriate row of the array. Even though the memory cells in the selected row are activated, no data is written into them because the write drivers are not connected to the bit lines. Thus, the address decoding is completed prior to receiving the match signal from the tag RAM.

When a logic high Match signal 88 is input to data cache 60, Write signal 86 is allowed to resume propagation through data cache 60, without any additional delays caused by address set-up time. In the prior art, write initialization is delayed to allow set-up of proper address locations prior to the actual write. The Match signal 88 does not have these constraints. In this way, Match signal 88 enables the writing of the appropriate memory cell as soon as possible. A clear benefit of this is that the write could possibly be accomplished in a single cycle, thereby avoiding microprocessor wait states. The mechanism for data cache writes now more closely resembles the parallel way in which read cycles are accomplished; some of the data cache access occurs while the tag RAM is being accessed. If, on the other hand, the Match signal 88 is a logic low, final gating of the data from the data cache is not allowed and no harm is done. The "miss" Match signal 88 is an input to logic gates 78 and 80 of data cache 60. The logic low Match signal 88 does not allow Write signal 86 to propagate past logic gates 78 and 80.

While the invention has been particularly shown and described with reference to two preferred embodiments, it will be understood by those skilled in the art that various changes in form and detail may be made therein without departing from the spirit and scope of the invention. For example, it will be understood by those skilled in the art that the Match signal input to the data cache 60 could be any signal which is a derivation of the Match signal 88. For instance, the extra input to the data cache could be a second write pin. Another embodiment of the invention would be to gate Match signal 88 with COL 70 of the column decode logic. An advantage of this would be that the gating of the write signal would be performed closer to memory cell 62. The gating of COL 70 and Match signal 88 could be accomplished with a AND gate similar to NAND logic gates 78 and 80.

What is claimed is:

1. A data cache memory, comprising:
   a memory matrix of the data cache memory which stores a data of the data cache memory, wherein said memory matrix has a plurality of rows and columns and a plurality of memory cells;
   a decode logic coupled to said memory matrix which provides decoding ability for the plurality of rows and columns of said memory matrix;
   a plurality of data input-output buffers coupled to said memory matrix through which the data is written to or read from said memory matrix thus providing the data cache memory with an interface ability;
   a write driver circuitry, connected to said decode logic, having a write input signal, a match input signal, and a data input signal, wherein the write driver circuitry allows the data cache memory to interface with an external circuitry; and
   means, included in said write driver circuitry, for preventing completion of a write cycle from a microprocessor until a valid match signal is received.

2. The data cache memory of claim 1, where said preventing means only allows said write input signal of said write cycle to propagate to a logic gate of said data cache memory until said valid match signal is received, wherein said logic gate is in close proximity to a memory cell of the plurality of memory cells of said memory matrix.

3. The data cache memory of claim 2, wherein said write input signal will be allowed to propagate to the memory cell to write said memory cell when said valid match signal is received.

4. The data cache memory of claim 3, wherein said preventing means is a gating logic internal to said data cache memory with said match input signal and said write input signal as input signals.

5. The data cache memory of claim 4, wherein said gating logic allows said write input signal to only propagate to said logic gate of said data cache memory when said match input signal is at a specific logic level.

6. The data cache memory of claim 3, wherein said preventing means is a gating logic internal to said data cache memory with said match input signal, said write input signal, and said data input signal as input signals.

7. The data cache memory of claim 6, where said gating logic allows said write input signal to only propagate to said logic gate of said data cache memory when said match input signal is at a specific logic level.

8. The data cache memory of claim 7, wherein the specific logic level of said match input signal is a logic low.

9. The data cache memory of claim 7, wherein said gating logic is a NAND gate with said match input signal, said write input signal and said data input signal as input signals of said NAND gate, and said NAND gate has an output signal which is connected to said decode logic.

10. The data cache memory of claim 7, wherein said gating logic allows said write input signal to finish propagation to reach said memory cell when said data input signal, said write input signal, and said match input signal are equal to a predetermined logic level.

11. The data cache memory of claim 10, wherein said predetermined logic level is a logic high.

12. The data cache memory of claim 1, wherein a memory cell of the plurality of memory cells is connected to said decode logic via bitlines and wordlines.

13. A method for writing data to a memory array of a data cache memory, comprising the steps of:

decoding an input address;

selecting a row of the memory array of the data cache memory corresponding to the decoded address;

preventing a data from being written into said memory array while the input address is being decoded; and upon receipt of a control signal, enabling the data to be written into the memory array.

14. The method of claim 13, wherein the control signal is a match signal generated by a cache tag memory and the data is written to the memory array only when the control signal indicates a cache hit.

* * * * *